United States Patent
Arnold et al.

(10) Patent No.: US 10,873,026 B2
(45) Date of Patent: Dec. 22, 2020

(54) ALIGNMENT OF CARBON NANOTUBES IN CONFINED CHANNELS

(71) Applicant: Wisconsin Alumni Research Foundation, Madison, WI (US)

(72) Inventors: Michael Scott Arnold, Middleton, WI (US); Katherine Rose Jinkins, Madison, WI (US); Gerald Joseph Brady, Madison, WI (US); Padma Gopalan, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 134 days.

(21) Appl. No.: 15/455,587

(22) Filed: Mar. 10, 2017

(65) Prior Publication Data

US 2018/0261772 A1    Sep. 13, 2018

(51) Int. Cl.
*H01L 51/00* (2006.01)
*C01B 32/168* (2017.01)
(Continued)

(52) U.S. Cl.
CPC ........ *H01L 51/0003* (2013.01); *C01B 32/168* (2017.08); *C01B 32/172* (2017.08); *H01L 51/0012* (2013.01); *H01L 51/0048* (2013.01); *B82Y 10/00* (2013.01); *B82Y 30/00* (2013.01); *B82Y 40/00* (2013.01); *C01B 2202/08* (2013.01); *H01L 51/0558* (2013.01); *Y10S 977/746* (2013.01); *Y10S 977/847* (2013.01); *Y10S 977/891* (2013.01)

(58) Field of Classification Search
CPC ............. H01L 51/0003; H01L 51/0048; H01L 51/0558; C01B 32/168; C01B 2202/08; B82Y 30/00; B82Y 40/00; Y10S 977/746; Y10S 977/847; Y10S 977/891; H05K 1/92; H05K 3/107
USPC ......................................................... 427/58
See application file for complete search history.

(56) References Cited

U.S. PATENT DOCUMENTS

| 6,741,017 B1 * | 5/2004 | Ide ................... B82Y 10/00 313/309 |
| 6,872,645 B2 * | 3/2005 | Duan ................. B81C 3/005 257/1 |

(Continued)

FOREIGN PATENT DOCUMENTS

| CN | 1656264 | 8/2005 |
| JP | 2002-226209 | 8/2002 |

(Continued)

OTHER PUBLICATIONS

International Search Report and Written Opinion mailed in PCT/US2018/012480, dated Mar. 26, 2018.
(Continued)

*Primary Examiner* — Brian K Talbot
(74) *Attorney, Agent, or Firm* — Bell & Manning, LLC; Michelle Manning

(57) ABSTRACT

Methods for forming carbon nanotube arrays are provided. Also provided are the arrays formed by the methods and electronic devices that incorporate the array as active layers. The arrays are formed by flowing a fluid suspension of carbon nanotubes through a confined channel under conditions that create a velocity gradient across the flowing suspension.

21 Claims, 12 Drawing Sheets

(51) Int. Cl.

| | | |
|---|---|---|
| C01B 32/172 | (2017.01) | |
| B82Y 40/00 | (2011.01) | |
| B82Y 30/00 | (2011.01) | |
| H01L 51/05 | (2006.01) | |
| B82Y 10/00 | (2011.01) | |

(56) References Cited

U.S. PATENT DOCUMENTS

| | | | |
|---|---|---|---|
| 6,896,864 B2* | 5/2005 | Clarke | B82Y 30/00 423/445 R |
| 7,060,241 B2* | 6/2006 | Glatkowski | B82Y 10/00 423/447.1 |
| 7,151,209 B2 | 12/2006 | Empedocles et al. | |
| 7,226,818 B2 | 6/2007 | Malenfant et al. | |
| 7,422,980 B1 | 9/2008 | Duan et al. | |
| 7,875,320 B2 | 1/2011 | Park et al. | |
| 8,128,993 B2 | 3/2012 | Rueckes et al. | |
| 8,216,636 B2* | 7/2012 | Chan | B82Y 10/00 427/117 |
| 8,313,795 B2 | 11/2012 | Kadono | |
| 8,455,055 B1 | 6/2013 | Humfeld | |
| 9,368,723 B2 | 6/2016 | Arnold et al. | |
| 9,425,405 B1 | 8/2016 | Arnold et al. | |
| 2003/0180472 A1 | 9/2003 | Zhou et al. | |
| 2004/0192072 A1 | 9/2004 | Snow et al. | |
| 2005/0208304 A1 | 9/2005 | Collier et al. | |
| 2006/0081882 A1 | 4/2006 | Malenfant et al. | |
| 2007/0246784 A1 | 10/2007 | Kang et al. | |
| 2008/0020487 A1* | 1/2008 | McLean | B82Y 30/00 438/1 |
| 2008/0199626 A1 | 8/2008 | Zhou et al. | |
| 2008/0224123 A1* | 9/2008 | Martin | B82B 3/00 257/23 |
| 2008/0296563 A1 | 12/2008 | Bourgoin et al. | |
| 2009/0035469 A1* | 2/2009 | Sue | B82Y 30/00 427/282 |
| 2009/0052029 A1* | 2/2009 | Dai | B82Y 20/00 359/485.02 |
| 2009/0214816 A1 | 8/2009 | Hata et al. | |
| 2009/0246408 A1* | 10/2009 | Chan | B82Y 10/00 427/577 |
| 2009/0267060 A1 | 10/2009 | Forrest et al. | |
| 2010/0054995 A1* | 3/2010 | Kwon | B01L 3/502707 422/68.1 |
| 2010/0065829 A1 | 3/2010 | Forrest et al. | |
| 2010/0101983 A1* | 4/2010 | Butler | B82Y 30/00 209/552 |
| 2010/0127242 A1 | 5/2010 | Zhou et al. | |
| 2010/0183844 A1 | 6/2010 | Xiong et al. | |
| 2010/0203351 A1* | 8/2010 | Nayfeh | C03C 4/12 428/622 |
| 2010/0233360 A1 | 9/2010 | Lee et al. | |
| 2010/0247381 A1 | 9/2010 | Yodh et al. | |
| 2010/0320140 A1* | 12/2010 | Nowak | B01D 61/025 210/490 |
| 2011/0045660 A1* | 2/2011 | Romano | B82Y 10/00 438/478 |
| 2013/0122214 A1 | 5/2013 | Humfeld | |
| 2014/0120714 A1 | 5/2014 | Farmer et al. | |
| 2014/0342098 A1 | 11/2014 | Curran et al. | |
| 2015/0209198 A1 | 7/2015 | Aizenberg et al. | |
| 2017/0047460 A1 | 2/2017 | Naseem et al. | |
| 2017/0182718 A1* | 6/2017 | Hsiao | B29C 70/081 |
| 2017/0243668 A1* | 8/2017 | Pasquali | H01B 1/04 |

FOREIGN PATENT DOCUMENTS

| | | |
|---|---|---|
| JP | 2013-141631 | 7/2013 |
| WO | WO2011087913 | 7/2011 |
| WO | WO2013154490 | 10/2013 |

OTHER PUBLICATIONS

Pierard et al., Production of short carbon nanotubes with open tips by ball milling, Chemical Physics Letters 335 (2001), pp. 1-8. no month available.

Tardani, Shear Orientation in Nematic Carbon Nanotube Dispersions: A Combined NMR Investigation, J. Phys. Chem. C 117, Mar. 27, 2013, pp. 8556-8562.

Ma et al., Experimental observation on the flow-induced assembly of Carbon nanotube suspensions to form helical bands, Rheol Acta 46 (2007), pp. 979-987. no month available.

Shastry et al., Large-area, electronically monodisperse, aligned single-walled carbon nanotube thin films fabricated by evaporation-driven self-assembly, Small, vol. 9, Sep. 17, 2012, pp. 45-51.

Lemieux et al., Self-sorted, aligned nanotube networks for thin-film transistors, Science, vol. 321, Jul. 4, 2008, pp. 101-104. no month available.

Cao et al., Arrays of single-walled carbon nanotubes with full surface coverage for high-performance electronics, Nat. Nanotechnol., vol. 8, Jan. 27, 2013, pp. 180-186.

Shekhar et al., Ultrahigh density alignment of carbon nanotube arrays by dielectrophoresis, ACS Nano, vol. 5, Feb. 16, 2011, pp. 1739-1746.

Engel et al., Thin Film Nanotube Transistors Based on Self-Assembled, Aligned, Semiconducting Carbon Nanotube Arrays, ACS Nano, vol. 2, Dec. 9, 2008, pp. 2445-2452.

Hong et al., Improved Density in Aligned Arrays of Single-Walled Carbon Nanotubes by Sequential Chemical Vapor Deposition on Quartz, Adv. Mater., vol. 22, Jan. 7, 2010, pp. 1826-1830.

Sangwan et al., Fundamental Performance Limits of Carbon Nanotube Thin-Film Transistors Achieved Using Hybrid Molecular Dielectrics, ACS Nano, vol. 6, No. 8 , Jul. 11, 2012, pp. 7480-7488.

Miyata et al., Length-sorted semiconducting carbon nanotubes for high-mobility thin film transistors, Nano. Research, vol. 4, No. 10, Oct. 2011, pp. 963-970.

Kang et al., High-performance electronics using dense, perfectly aligned arrays of single-walled carbon nanotubes, Nat. Nanotechnol., vol. 2, No. 4, Mar. 25, 2007, pp. 230-236.

Jin et al., Using nanoscale thermocapillary flows to create arrays of purely semiconducting single-walled carbon nanotubes , Nat. Nanotechnol., vol. 8, No. 5, Apr. 28, 2013, pp. 347-355.

Sun et al., Flexible high-performance carbon nanotube integrated circuits, Nat. Nanotechnol., vol. 6, No. 3, Feb. 6, 2011, pp. 156-161.

Kim et al., Low voltage, high performance inkjet printed carbon nanotube transistors with solution processed $ZrO_2$ gate insulator, App. Phys. Lett., vol. 103, No. 8, Aug. 23, 2013, pp. 082119-1-082119-4.

Wu et al., Self-Assembly of Semiconducting Single-Walled Carbon Nanotubes into Dense, Aligned Rafts, Small, Jul. 11, 2013, vol. 9, No. 24, pp. 4142-4148.

Ma et al., The production of horizontally aligned single-walled carbon nanotubes, Carbon, vol. 49, Jun. 24, 2011, pp. 4098-4110.

Mistry et al., High-Yield Dispersions of Large-Diameter Semiconducting Single-Walled Carbon Nanotubes with Tunable Narrow Chirality Distributions, ACS Nano, vol. 7. No. 3, Feb. 4, 2013, pp. 2231-2239.

Qian et al., Electrical and Photoresponse Properties of Printed Thin-Film Transistors Based on Poly(9,9-dioctylfluorene-co-bithiophene) Sorted Large-Diameter Semiconducting Carbon Nanotubes, J. Phys. Chem. C, vol. 117, Aug. 8, 2013, pp. 18243-18250.

Joo et al., "Dose-controlled, floating evaporative self-assembly and alignment of semiconducting carbon nanotubes from organic solvents," Langmuir, Mar. 2, 2014, vol. 30, pp. 3460-3466.

International Search Report and Written Opinion issued for Intl. Patent Appl. No. PCT/US2015/015342, dated May 22, 2015.

Non-Final Office Action issued for U.S. Appl. No. 14/177,828, dated Aug. 27, 2015, 16 pp.

Extended European Search Report mailed in European Patent Application No. 15748675.4, dated Aug. 25, 2017.

Giancane et al., State of art in the preparation, characterisation and applications of Langmuir-Blodgett films of carbon nanotubes, Colloids and Surfaces A: Physicochem. Eng. Aspects 354, Oct. 2, 2009, pp. 81-90.

(56) References Cited

OTHER PUBLICATIONS

Zhang et al., Facile One-Step Fabrication of Ordered Organic Nanowire Films, Advanced Materials 21, Jun. 24, 2009, pp. 4172-4175.

Börzsönyi et al., Orientational Order and Alignment of Elongated Particles Induced by Shear. *Phys. Rev. Lett.* 108, Jun. 1, 2012, pp. 228302-1-228302-5.

Fry et al., Anisotropy of Sheared Carbon-Nanotube Suspensions. *Phys. Rev. Lett.* 95, Jul. 15, 2005, pp. 038304-1-038304-4.

Börzsönyi et al., Shear-induced alignment and dynamics of elongated granular particles. *Phys. Rev. E* 86, Nov. 21, 2012, pp. 051304-1-051304-8.

Zhu et al., Scalable alignment and transfer of nanowires in a spinning Langmuir film. *Nanoscale* 6, Aug. 5, 2014, pp. 11976-11980.

Brickweg et al., Shear-induced 1-D alignment of alumina nanoparticles in coatings. *J. Coat. Technol. Res.* 4, Nov. 1, 2006, pp. 107-110.

Jeong, et al., Fabrication of efficient field emitters with thin multiwalled carbon nanotubes using spray method. *Carbon* 44, Jun. 5, 2006, pp. 2689-2693.

Assad, O. et al., Spray-Coating Route for Highly Aligned and Large-Scale Arrays of Nanowires. *ACS Nano* 6, May 3, 2012, pp. 4702-4712.

Yao et al., A nanoscale combing technique for the large-scale assembly of highly aligned nanowires. *Nat. Nanotechnol.* 8, Apr. 21, 2013, pp. 329-335.

Derenskyi et al., Carbon Nanotube Network Ambipolar Field-Effect Transistors with $10^8$ On/Off Ratio. *Adv. Mater.* 26, Jul. 19, 2014, pp. 5969-5975.

Park et al. Large-Area Assembly of Densely Aligned Single-Walled Carbon Nanotubes Using Solution Shearing and Their Application to Field-Effect Transistors. *Adv. Mater.* 27, Mar. 18, 2015, pp. 2656-2662.

Huang et al., Directed Assembly of One-Dimensional Nanostructures into Functional Networks, Science, vol. 291, Jan. 26, 2001, pp. 630-633.

Dong et al., Anomalous orientations of a rigid carbon nanotube in a sheared fluid, Scientific Reports 4 : 6120, Aug. 19, 2014, pp. 1-7.

* cited by examiner

ALIGNMENT OF CARBON NANOTUBES IN CONFINED CHANNELS

REFERENCE TO GOVERNMENT RIGHTS

This invention was made with government support under 1462771 awarded by the National Science Foundation. The government has certain rights in the invention.

BACKGROUND

Single-walled carbon nanotubes (SWCNTs) are key building blocks for nanoscale science and technology due to their interesting physical and chemical properties. SWCNTs are particularly promising for high speed and low power semiconductor electronics. A challenge, however, is the hierarchical organization of these building blocks into organized assemblies and, ultimately, useful devices. Ordered structures are necessary, as random network SWCNT thin films result in sub-optimal electronic properties, including reduced channel conductance and mobility. Numerous techniques for aligning SWCNTs have been explored to solve this shortcoming and achieve higher conductance and mobility. These approaches can be divided into two main categories: (a) direct growth via chemical vapor deposition and arc-discharge, and (b) post synthetic assembly. In the case of direct growth, both metallic and semiconducting SWCNTs are produced. In this case, the performance of SWCNT field effect transistors (FETs) that include the SWCNTs in a channel layer is limited by the metallic SWCNTs (m-SWCNTs), thus motivating attempts to purify semiconducting SWCNT (s-SWCNT) samples with homogeneous electronic properties.

A variety of post-synthetic sorting methods have been developed to separate m- and s-SWCNTs according to their specific physical and electronic structures, which are usually implemented in aqueous or organic solutions. In order to take advantage of the high purity of s-SWCNTs that can be produced by these solution-based sorting approaches in semiconductor electronic devices, solution-based methods for assembling and aligning s-SWCNTs, such as evaporation-driven self-assembly, blown-bubble assembly, gas flow self-assembly, spin-coating, Langmuir-Blodgett and -Shafer methods, contact-printing assembly, and AC electrophoresis, have been developed. While each of these methods has its strengths, new methods are still needed to improve the fidelity of s-SWCNT assembly and alignment in order to enable the fabrication of practical s-SWCNT-based electronic devices.

SUMMARY

Methods for forming arrays of aligned carbon nanotubes are provided. Also provided are the arrays formed by the methods.

One embodiment of a method comprises creating a shear flow of a fluid suspension of organic material-coated carbon nanotubes through a flow channel that is defined by a deposition substrate and a confining wall, wherein a velocity gradient is formed across the flowing fluid suspension; and depositing organic material-coated carbon nanotubes from the fluid suspension onto the deposition substrate, wherein the deposited organic material-coated carbon nanotubes are aligned along the direction of shear flow. The flow channel can be a closed channel or an open channel.

In some embodiments of the methods, the fluid suspension of organic material-coated carbon nanotubes flows over the deposition substrate at a rate that is greater than the rotational diffusion coefficients of the carbon nanotubes in the fluid suspension.

In some embodiments of the methods, the fluid suspension flows over a liquid that is immiscible with the fluid suspension in an open channel. Alternatively, a liquid that is immiscible with the fluid suspension can be flowed through a closed channel along with the fluid suspension, such that the fluid suspension and the immiscible liquid flow side-by-side. This creates an interface between the fluid suspension and the immiscible liquid at which the carbon nanotubes become aligned and concentrated, relative to their concentration in the bulk of the fluid suspension. By translating the interface across the deposition substrate, an array of aligned carbon nanotubes can be deposited over a large surface area.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1A:
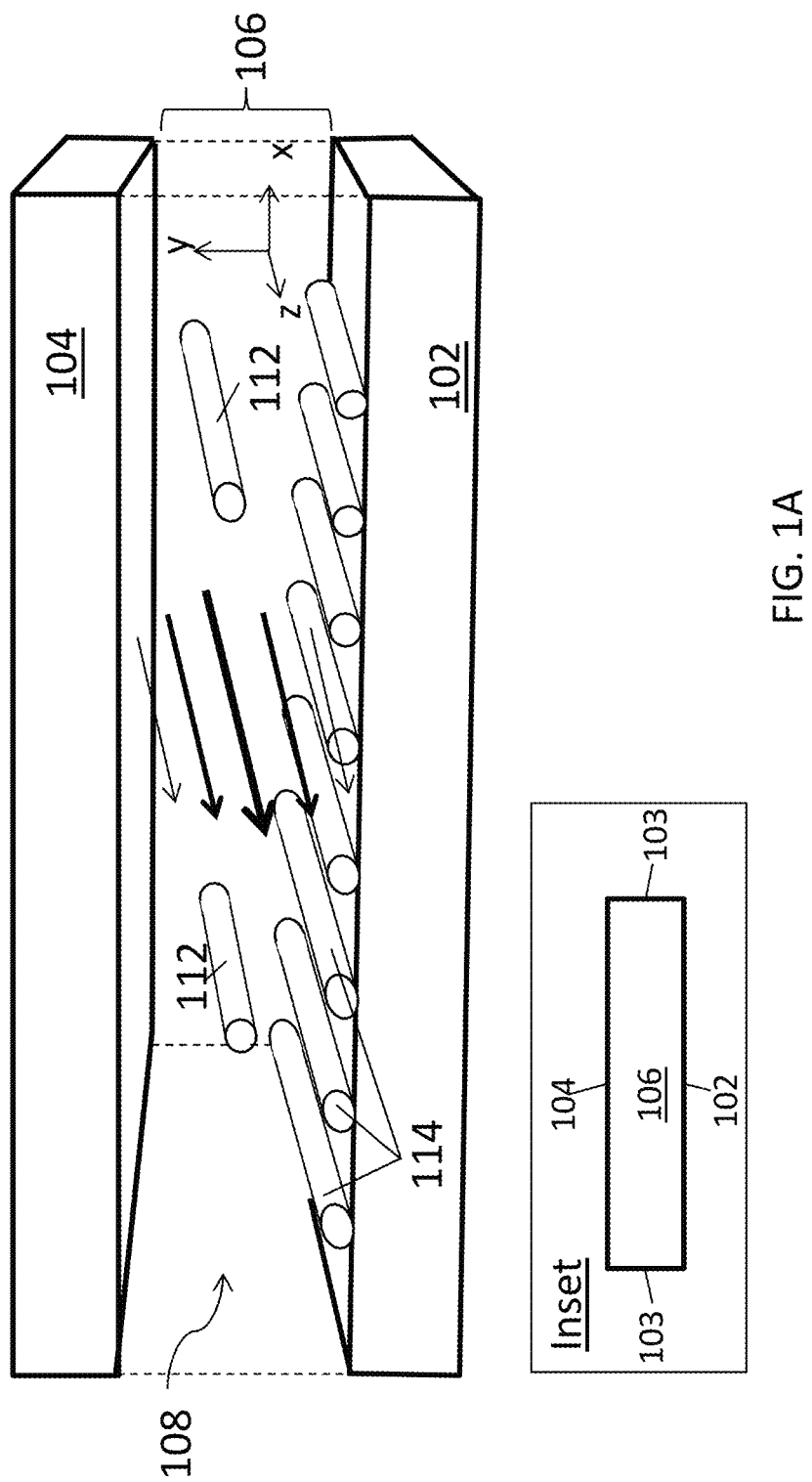
FIG. 1A is a schematic diagram of an aligned carbon nanotube array being deposited in a closed, confined flow channel.

Methods for forming arrays of aligned carbon nanotubes. Also provided are the arrays formed by the methods and electronic devices that incorporate the arrays as active layers.

The arrays are formed by flowing a fluid suspension of carbon nanotubes through a confined channel under conditions that create a velocity gradient across the flowing suspension. In some embodiments of the methods, the fluid suspension of carbon nanotubes flows across another liquid to provide a liquid/fluid suspension interface at which the carbon nanotubes become concentrated. As a result of the accumulation/confinement of the carbon nanotubes at the liquid/fluid suspension interface, the shear forces acting on the carbon nanotubes, or a combination of both effects, the carbon nanotubes become aligned along the flow direction as they flow over, and are deposited upon, a deposition substrate. The methods provide a rapid and scalable means of forming a film of aligned carbon nanotubes over a large surface area. By adjusting the flow parameters and channel dimensions and design, the degree of alignment and linear packing density of the carbon nanotubes in the deposited arrays can be controlled.

The carbon nanotubes may be SWCNTs, including SWCNTs processed from high pressure carbon monoxide (HiPco) produced powders and SWCNTs made via arc-discharge methods. The carbon nanotubes are characterized by very small diameters; for example, less than 5 nm and more typically less than 2 nm. Carbon nanotubes of various lengths can be aligned using the methods. This includes very short carbon nanotubes that have lengths of no greater than 1 µm, or even no greater than 0.5 µm. This is significant because short nanotubes are substantially more difficult to align than their longer counterparts. In a sample (e.g., powder) of carbon nanotubes in which the dimensions of the individual carbon nanotubes vary, the dimensions recited above refer to the average dimensions for the carbon nanotubes in the sample. However, the samples can be selected such that none of the carbon nanotubes in the sample exceed the maximum dimensions recited above. For some device applications, it is desirable for the carbon nanotubes to be semiconducting SWCNTs (s-SWCNTs). Therefore, the carbon nanotubes used in the methods can be pre-sorted to remove all, or substantially all (e.g., >90%), of the metallic SWCNTs (m-SWCNTs).

The individual carbon nanotubes can be coated with an organic material in order to facilitate their alignment and deposition onto a substrate and to avoid aggregation in the fluid suspension or in the deposited array. For clarification, these coated carbon nanotubes each have a partial or complete film of an organic material on their surface; they are not all distributed in a continuous organic (e.g., polymer) matrix. The coatings may be, but need not be, covalently bonded to the surfaces of the carbon nanotube. Organic materials that form the coatings include monomers, oligomers, polymers, and combinations thereof. The coating may be a coating that was used in a pre-sorting step to isolate s-SWCNTs from a mixture of s-SWCNTs and m-SWCNTs. These types of coatings are referred to herein as semiconductor-selective coatings. A number of semiconductor-selective coatings are known, including semiconductor-selective polymer coatings. Descriptions of such polymers can be found, for example, in Nish, A.; Hwang, J. Y.; Doig, J.; Nicholas, R. J. Highly selective dispersion of single-walled carbon nanotubes using aromatic polymers. *Nat. Nanotechnol.* 2007, 2, 640-6. The semiconductor-selective polymers are typically organic polymers with a high degree of π-conjugation and include polyfluorene derivatives, such as poly (9,9-dialkyl-fluorene) derivatives, and poly(phenyl vinylene) derivatives. While the semiconductor-selective coatings may be conductive or semiconductive materials, they can also be electrically insulating. Optionally, the coatings can be removed from the carbon nanotubes after the carbon nanotube arrays have been deposited. For example, the coatings can be selectively dissolved or etched away. Alternatively, for polymers having a bi-pyridine repeat unit, the coatings can be removed via exposure to a transition metal salt, such as a transition metal (e.g., rhenium) carbonyl salt, as described in U.S. Pat. No. 9,327,979.

The carbon nanotubes are dispersed in solution to provide a fluid suspension of the carbon nanotubes. A wide variety of organic solvents and mixtures of organic solvents can be used to form the solution, provided that the solvents are able to solubilize the carbon nanotubes. In embodiments of the methods where an open, confined channel is used, the organic solvent desirably has a relatively high boiling point at the film deposition temperature and pressure, typically ambient temperature and pressure, such that it evaporates slowly. Examples of solvents having relatively high boiling points include toluene and 1,2-dichlorobenzene. However, lower boiling organic solvents, such as chloroform, can also be used. The concentration of the carbon nanotubes in the fluid suspension may affect the density of the carbon nanotubes in the deposited arrays, particularly when the deposition time or the area of the deposition interface is limited. A wide range of carbon nanotube concentrations can be employed. By way of illustration only, in some embodiments of the methods, the fluid suspension has a carbon nanotube concentration in the range from 0.01 µg/mL to 250 µg/mL.

The methods are carried out by creating a flow of the fluid suspension comprising the carbon nanotubes through a confined flow channel, whereby a flow velocity gradient is formed across the flowing suspension. The confined flow channel is a narrow conduit that is defined by the deposition substrate and a confinement substrate. The deposition substrate is the substrate onto which the carbon nanotubes are deposited to form the carbon nanotube array. Therefore, this substrate should be composed of a material to which the carbon nanotubes, including coated SWCNTs, readily adhere. Different deposition substrate materials may be preferred for different carbon nanotube coating materials and/or for different channel geometries. In some embodiments of the methods, hydrophilic substrates, such as silicon oxide (e.g., $SiO_2$) can be used. In other embodiments, non-hydrophilic substrates or hydrophilic substrates can also be used. Other deposition substrate materials that can be used include metal oxides (including, but not limited to, aluminum oxide, hafnium oxide, and lanthanum oxide), high-k dielectric materials, such as SiN, and common semiconductor materials, such as silicon and germanium. The deposition substrate can also be a polymer substrate for flexible electronics applications, including but not limited to, polydimethylsiloxane, polyethersulfone, poly (ethylene terephthalate), and the like. These materials may compose the deposition substrate, or may be applied as coatings over a bulk substrate base.

The confinement substrate, together with the deposition substrate, defines the flow channel. The confinement substrate material should be selected such that the carbon nanotubes adhere less readily to the confinement substrate than to the deposition substrate during the carbon nanotube array deposition process. Thus, different confinement substrate materials may be preferred for different carbon nanotube coating materials and/or for different channel geometries. By way of illustration only, for organic material-coated carbon nanotubes that adhere well to a hydrophobic deposition substrate, the confinement substrate may be composed of a material that is less hydrophobic than the material from which the deposition substrate is composed. Similarly, for organic material-coated carbon nanotubes that adhere well to a hydrophilic deposition substrate, the confinement substrate may be composed of a material that is less hydrophilic than the material from which the deposition substrate is composed. Examples of suitable materials for the confinement substrate include, but are not limited to, fluoropolymers, such as polytetrafluoroethylene and Viton, and glass or quartz coated with a hydrophobic polymer. Uncoated glass and quartz can also be used. It is not necessary to eliminate the deposition of carbon nanotubes on the confinement substrate. However, if deposition of the carbon nanotubes on the confinement substrate is significant, it may be desirable to periodically replace the confinement substrate or to clear the confinement substrate of the deposited carbon nanotubes.

The deposition substrate and the confinement substrate can be arranged such that they form a closed, confined channel or an open, confined channel. A closed, confined channel is a conduit that surrounds the flowing suspension of carbon nanotubes around its circumference, and, in a closed, confined channel, the flowing suspension of carbon nanotubes is not exposed to air on any side as it flows through the conduit. In some embodiments of the closed channels, the deposition substrate is a planar substrate. In a closed channel carbon nanotube deposition system, the deposition substrate can remain stationary as the fluid suspension of carbon nanotubes flows over it, as discussed in more detail in Example 1.

A schematic illustration of one embodiment of a portion of a closed, confined channel is shown in FIG. 1A. As a suspension of carbon nanotubes flows through the closed, confined channel, a flow velocity gradient (shear rate) gives rise to shear forces that align the carbon nanotubes with their long axes (lengths) along the direction of the flow. When the carbon nanotubes in the fluid suspension contact a deposition substrate they are deposited on the surface of that substrate with their long axes oriented in the direction of the flow.

The channel is defined by a deposition substrate 102 and a confinement substrate 104. (Only the top portion ("ceiling") of the confinement substrate is show in this figure, the confinement substrate further includes side walls (i.e., walls in the yz plane; not shown) that confine the fluid suspension laterally. The side walls 103 are shown in the simplified front view of the channel in the inset.) A conduit 106 is defined by deposition substrate 102 and confinement substrate 104. When a fluid suspension 108 of carbon nanotubes flows through conduit 106, velocity gradients are formed across the fluid between deposition substrate 102 and confinement substrate 104. (The velocity gradients along the y-direction are represented by arrows, the sizes of which correspond to the velocity in that part of the channel.) As a result, carbon nanotubes 112 in fluid suspension 108 become aligned along the flow direction (the z-axis in the figure) and the aligned carbon nanotubes are deposited onto deposition substrate 102 to form an array of aligned carbon nanotubes 114. Confinement substrate 104 may be composed of more than one material. For example, in the embodiment shown here, walls 103 may be provided by a rubber spacer (or rubber spacers), sandwiched between the deposition substrate and the upper portion of confinement substrate 104, where the upper portion may be a composed of a material other than rubber.

Figure 1B:
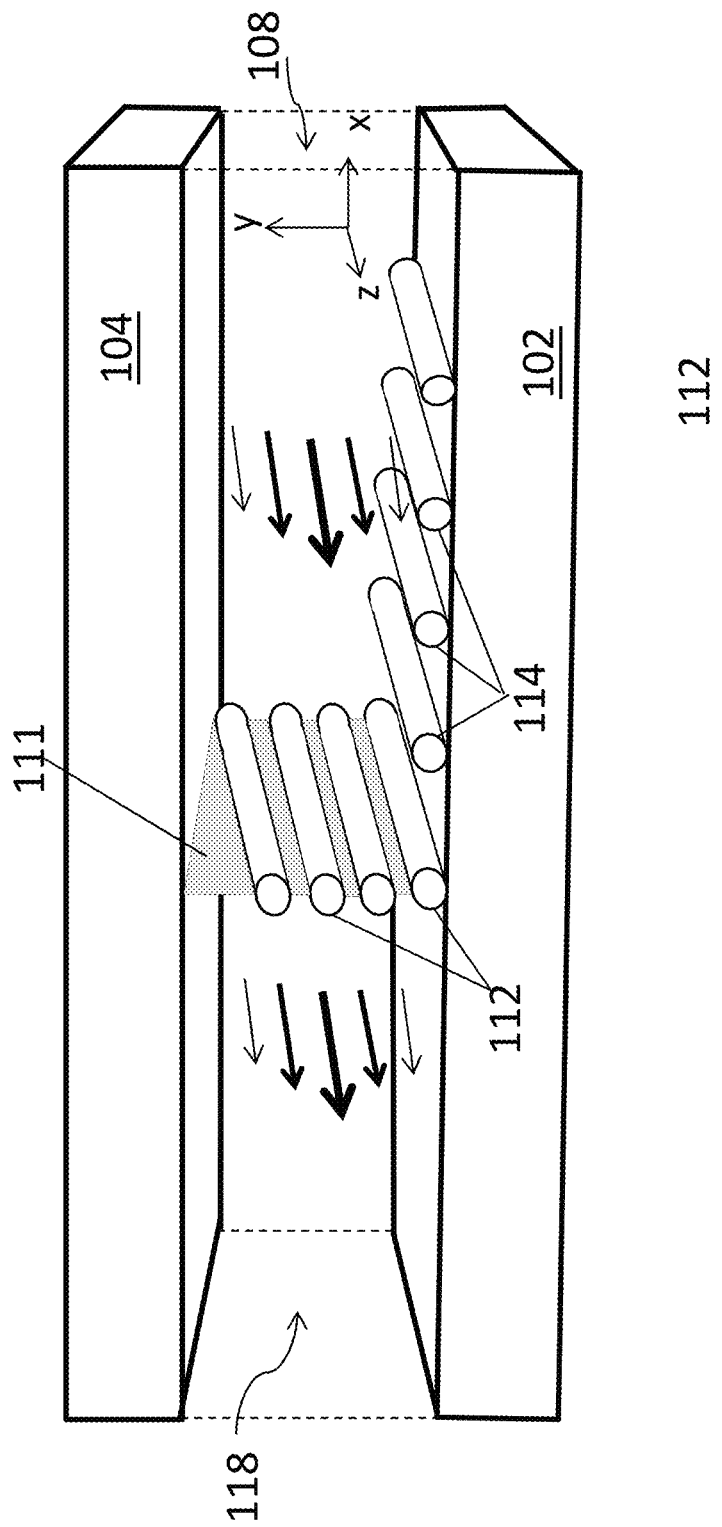
FIG. 1B is a schematic diagram of an aligned carbon nanotube array being deposited in another embodiment of a closed, confined flow channel.
Figure 1C:
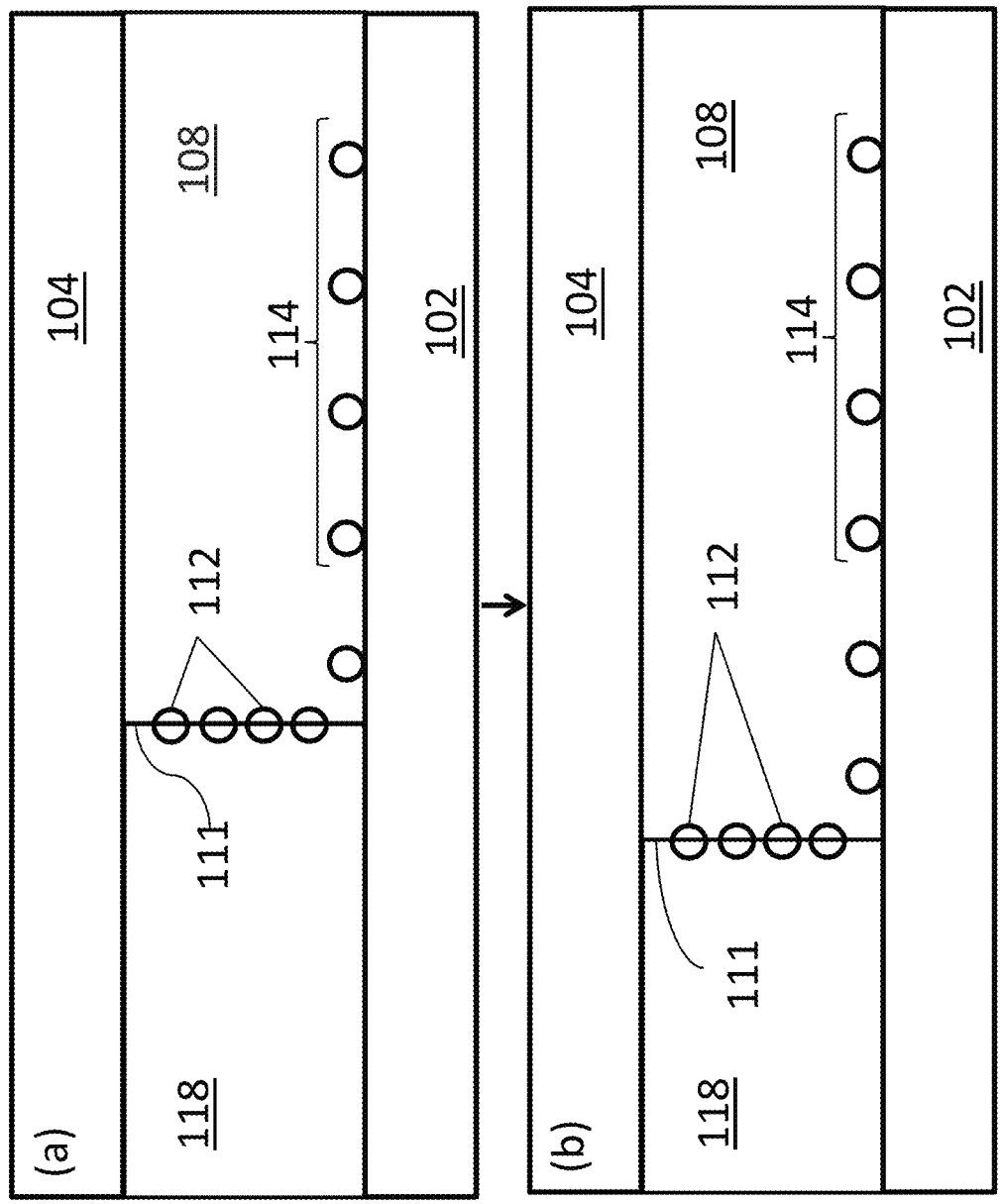
FIG. 1C is a schematic diagram showing the translation of a liquid/fluid suspension interface translating across the deposition substrate using the deposition system of FIG. 1B.

Another embodiment of a portion of a closed, confined channel is shown in FIG. 1B. In this embodiment, the closed, confined channel has the same configuration as the embodiment shown in FIG. 1A, but the fluid suspension is flowed through the channel along with another liquid 118, such that fluid suspension 108 and liquid 118 flow side-by-side between deposition substrate 102 and confinement substrate 104. Liquid 118 selected such that it is immiscible with fluid suspension 108. For example, liquid 118 may be water. As a result, a fluid suspension/liquid interface 111 is formed between the two layers. As fluid suspension 108 and liquid 118 flow through the channel, carbon nanotubes 112 in the suspension become aligned along the direction of flow and concentrated at interface 111. This creates a thin contact line of concentrated carbon nanotubes from which aligned carbon nanotubes 112 are deposited onto deposition substrate 102 to form an array of aligned carbon nanotubes 114. By changing the volumetric flow rate of fluid suspension 108 relative to the volumetric flow rate of liquid 118, interface 111 can be translated across deposition surface 102 to form a continuous array 114 over a large surface area. This progression is illustrated schematically in FIG. 1C, where panel (a) shows the position of interface 111 at a first relative volumetric flow rate and panel (b) shows the position of interface 111 translated further along deposition substrate 102 after reducing the volumetric flow rate of liquid 118 relative to that of fluid suspension 108. Alternatively, the relative volumetric flow rates of liquid 118 and fluid suspension 108 can be held constant and the array 114 of carbon nanotubes 112 can be deposited over deposition substrate 102 by translating the deposition substrate in a direction perpendicular to interface 111 as the liquid and the fluid suspension are flowing through the channel.

Figure 1D:
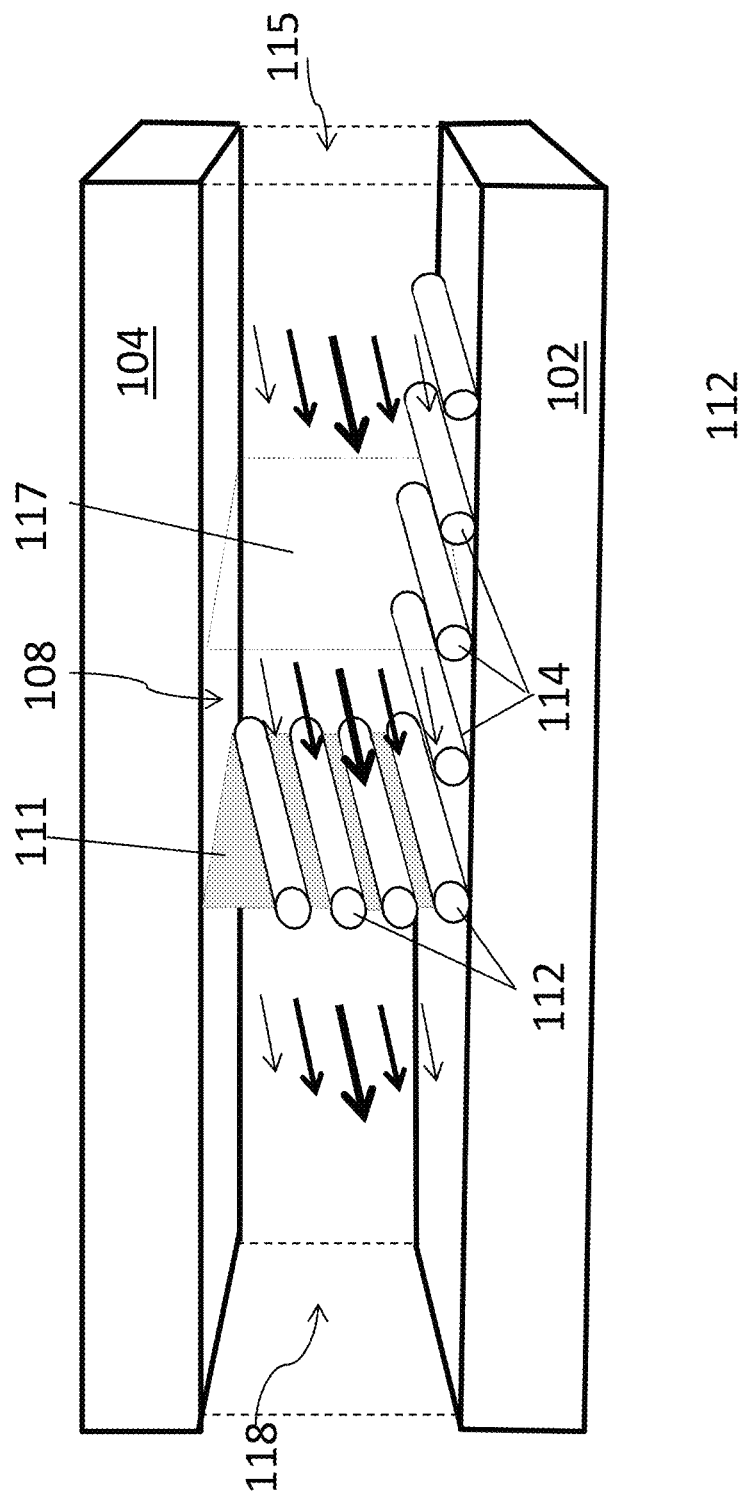
FIG. 1D is a schematic diagram of an aligned carbon nanotube array being deposited in yet another embodiment of a closed, confined flow channel.

Another embodiment of a portion of a closed, confined channel is shown in FIG. 1D. In this embodiment, the closed, confined channel has the same configuration as the embodiment shown in FIG. 1B, except that the fluid suspension of carbon nanotubes 108 is flanked by liquid 118 on one side and by a solvent 115 on the opposite side. Solvent 115 can be the same solvent in which the carbon nanotubes of the fluid suspension are suspended, or it can be a different solvent in which the carbon nanotubes are not soluble or dispersible, such that a second liquid/liquid interface 117 is formed in the channel. In some embodiments, solvent 115 is a fluorinated organic solvent. As in the embodiment shown in FIG. 1B, carbon nanotubes 112 in fluid suspension 108 become aligned along the direction of flow and concentrated at interface 111. This creates a thin contact line of concentrated carbon nanotubes from which aligned carbon nanotubes 112 are deposited onto deposition substrate 102 to form an array of aligned carbon nanotubes 114.

Figure 1E:
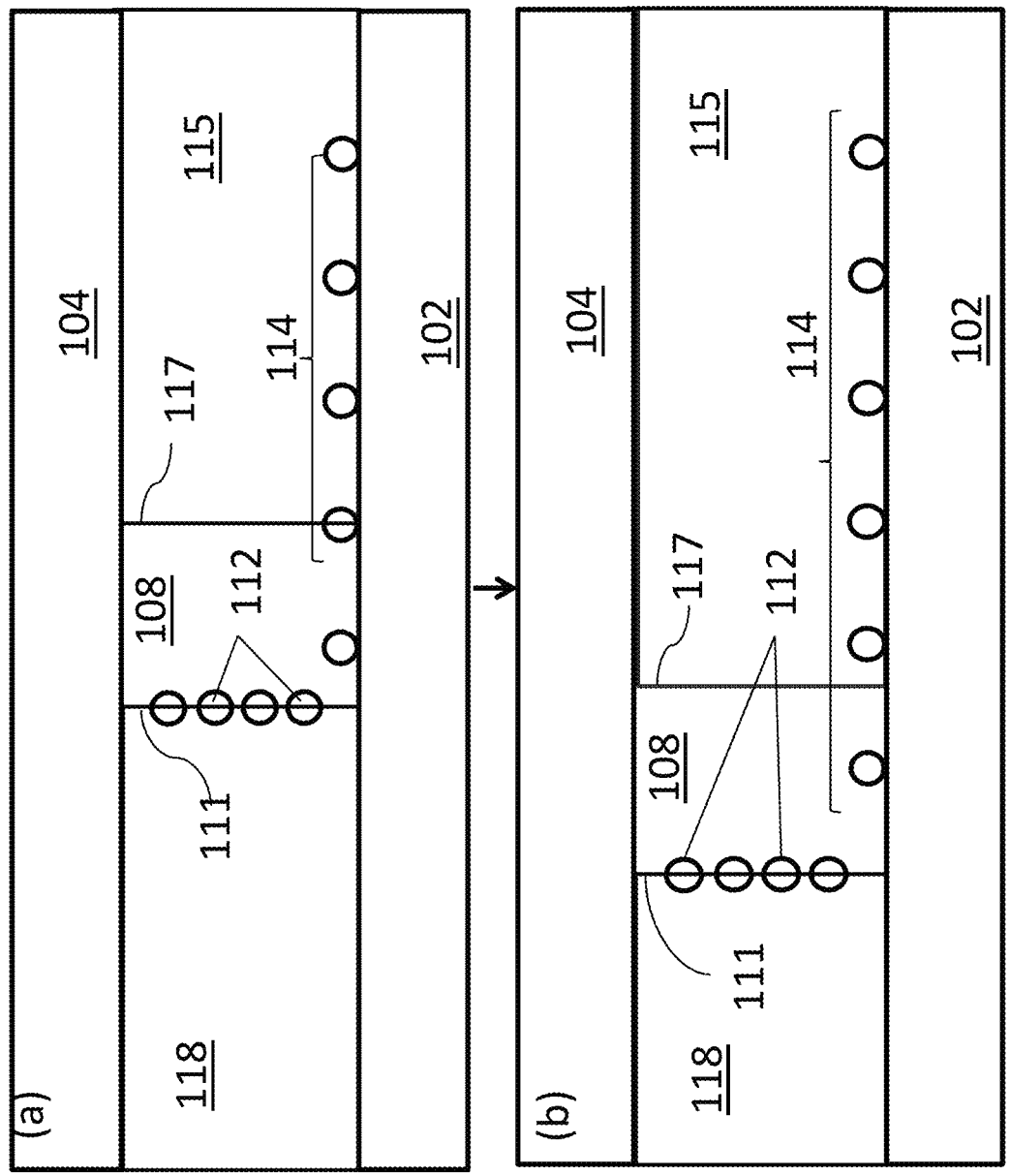
FIG. 1E is a schematic diagram showing the translation of a liquid/fluid suspension interface translating across the deposition substrate using the deposition system of FIG. 1D.

By changing the volumetric flow rate of solvent 115 relative to the volumetric flow rate of liquid 118, interface 111 can be translated across deposition surface 102 to form a continuous array 114 over a large surface area. This progression is illustrated schematically in FIG. 1E, where panel (a) shows the position of interface 111 at a first relative volumetric flow rate and panel (b) shows the position of interface 111 translated further along deposition substrate 102 after reducing the volumetric flow rate of liquid 118 relative to that of solvent 115. Alternatively, the relative volumetric flow rates of liquid 118 and solvent 115 can be held constant and the array 114 of carbon nanotubes 112 can be deposited over deposition substrate 102 by translating the deposition substrate in a direction perpendicular to interface 111 as the liquid and the fluid suspension are flowing through the channel.

Relative to the embodiment shown in FIG. 1B, the configuration shown in FIG. 1D uses a lower quantity of carbon nanotubes since a smaller volume of the fluid suspension of carbon nanotubes is required. In addition, if the carbon nanotubes are not soluble or dispersible in solvent 115, unwanted deposition of carbon nanotubes on the confinement substrate can be reduced or eliminated.

In embodiments of the type illustrated in FIGS. 1B-1E, the liquid, the fluid suspension, and the solvent can be introduced into the channel using separate inputs. The inputs can be configured such that the liquid, the fluid suspension, and the solvent enter the channel, for example, perpendicular or parallel to the flow direction. To establish a stable, well-defined liquid/fluid suspension interface, the flow cell, optionally, can be primed with an initial volume of the liquid, the fluid suspension, the solvent, or a combination of two or more thereof. This may be done in order to prevent uncontrollable surface wetting of the flow cell walls that might occur in the presence of an air/liquid interface.

The deposition and confinement substrates also can be arranged such that they form an open, confined channel. On open, confined channel is a trough-like conduit that has an open air space above the flowing suspension of carbon nanotubes. In some embodiments of the open channels, the deposition substrate and the confinement substrate are planar substrates that are disposed opposite and facing one another, separated by a gap. The facing surfaces of the deposition substrate and the confinement substrate can be, but need not be, oriented in a parallel arrangement. In these embodiments, the channel can be further defined by a layer of liquid, such as water, spanning the gap between the two substrates and serving as a channel floor. In this type of open, confined channel, the fluid suspension is flowed over the layer of liquid and between the deposition substrate and the confinement substrate. An array of carbon nanotubes can be deposited over an area of the deposition substrate by moving the deposition substrate in a direction perpendicular to the surface of the liquid as the suspension is flowing through the channel, or by translating the interface between the fluid suspension and the liquid across the deposition substrate as the suspension is flowing through the channel.

Figure 2:
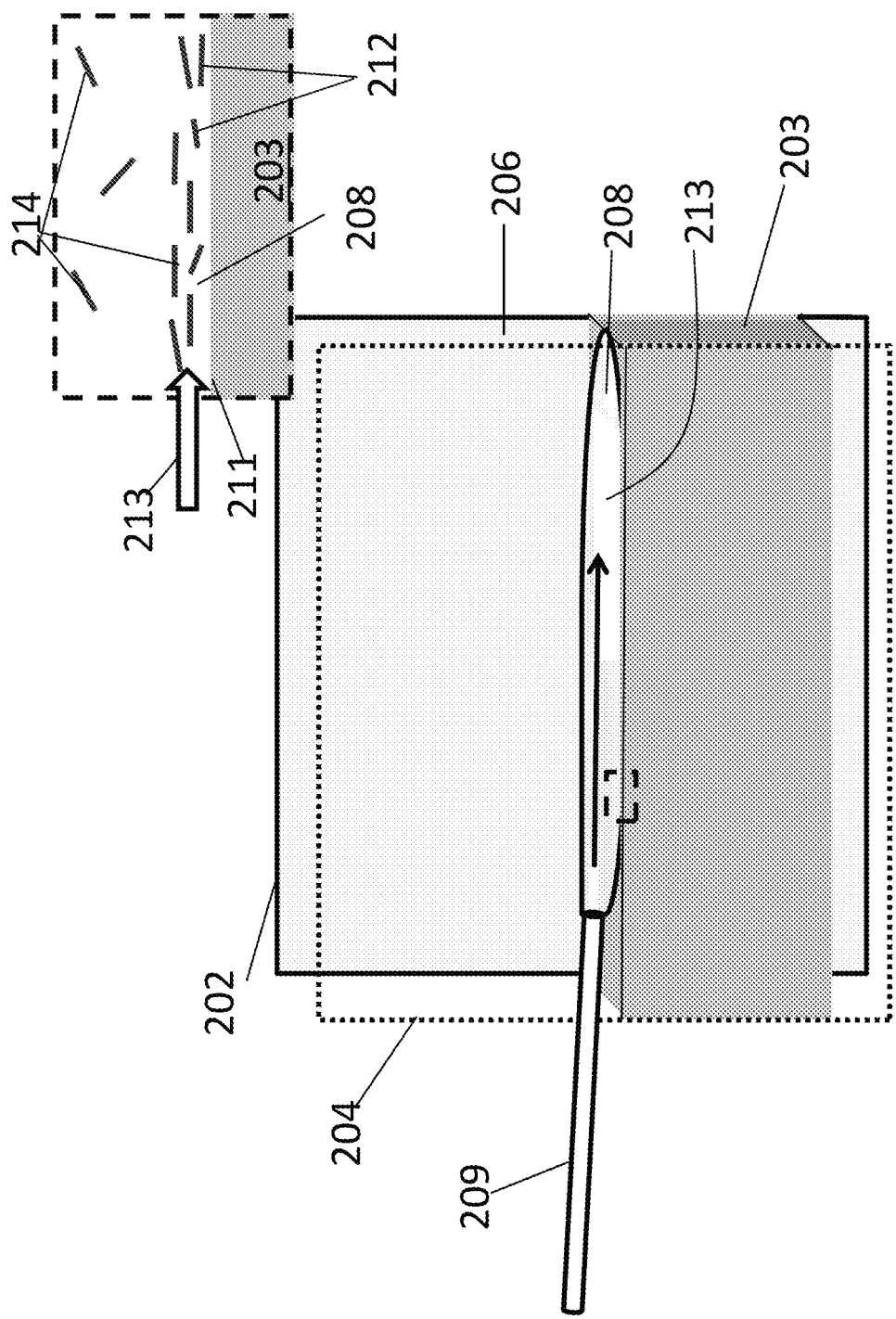
FIG. 2 is a schematic diagram of an aligned carbon nanotube array being deposited in an open, confined flow channel with a stationary liquid floor.

A schematic illustration of one embodiment of an open, confined channel is shown in FIG. 2. The channel is defined by a deposition substrate 202 and a confinement substrate 204. The channel is further defined by a layer of liquid 203, such as water, that provides a floor to the channel. A fluid suspension 208 of carbon nanotubes is introduced into the channel 206 through an input port (represented here by a needle 209 for simplicity). Liquid layer 203 and fluid suspension 208 are immiscible and, therefore, a fluid suspension/liquid interface 211 is formed between the two layers (see inset). As fluid suspension 208 flows over liquid layer 203, carbon nanotubes 212 in the suspension become aligned along the direction of flow 213 and concentrated at interface 211. From interface 211, aligned carbon nanotubes 212 are deposited onto deposition substrate 202 to form a film of aligned carbon nanotubes 214. By moving deposition substrate 202 across interface 211 as fluid suspension 208 is flowing, the film of aligned carbon nanotubes 214 can be formed continuously over a large surface area.

Figure 3:
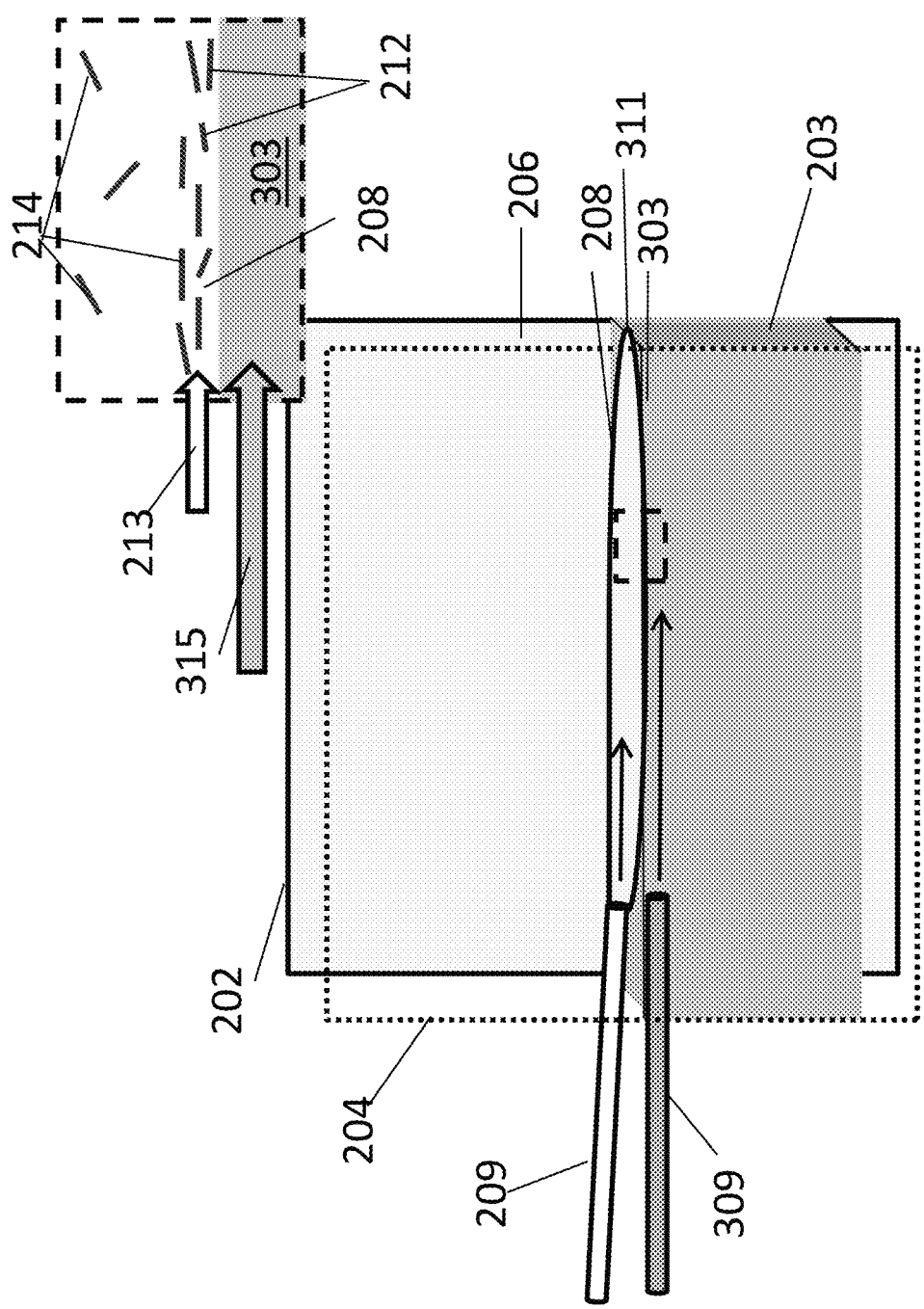
FIG. 3 is a schematic diagram of an aligned carbon nanotube array being deposited in an open, confined flow channel with a flowing liquid floor.

Another embodiment of an open, confined channel is shown schematically in FIG. 3. The components of this channel are the same as those of the embodiment of FIG. 2, except that a top portion of liquid layer 203 is a liquid film 303 flowing in the same direction 315 as fluid suspension 208 In some embodiments, liquid film 303 flows at a faster flow rate than fluid suspension 208. (The relative velocities of the fluid suspension and the liquid film are represented by arrows, the lengths of which correspond to the velocities of their respective layers.) As shown in the figure, flowing liquid film 303 can be provided below fluid suspension 208 by introducing the liquid into channel 206 through a separate input port (represented here by a needle 309 for simplicity), wherein an interface 311 is formed between fluid suspension 208 and liquid film 303. An advantage of using flowing liquid film 303 is that it reduces the drag on fluid suspension 208 and utilizes the flowing liquid film to achieve the high velocity and velocity gradients that give rise to shear flow. This reduction of drag on the fluid suspension 208 can result in better laminar flow, which may result in better alignment of the carbon nanotubes in the deposited film. By moving deposition substrate 202 across interface 311 as fluid suspension 208 is flowing, the array of aligned carbon nanotubes 214 can be formed continuously over a large surface area. In a variation of the method shown in FIG. 3, the entire layer of liquid 208 is flowing, rather than just a portion of the top layer of the liquid.

The components of this channel are the same as those of the embodiment of FIG. 2, except that a top portion of liquid layer 203 is a liquid film 303 flowing in the same direction 315 as, but at a faster flow rate than, fluid suspension 208. (The relative velocities of the fluid suspension and the liquid film are represented by arrows, the lengths of which correspond to the velocities of their respective layers.) As shown in the figure, flowing liquid film 303 can be provided below fluid suspension 208 by introducing the liquid into channel 206 through a separate input port (represented here by a needle 309 for simplicity), wherein an interface 311 is formed between fluid suspension 208 and liquid film 303. An advantage of using flowing liquid film 303 is that it reduces the drag on fluid suspension 208 and utilizes the flowing liquid film to achieve the high velocity and velocity gradients that give rise to shear flow. This reduction of drag on the fluid suspension 208 can result in better laminar flow, which may result in better alignment of the carbon nanotubes in the deposited array. By moving deposition substrate 202 across interface 311 as fluid suspension 208 is flowing, the array of aligned carbon nanotubes 214 can be formed continuously over a large surface area. In a variation of the method shown in FIG. 3, the entire layer of liquid 208 is flowing, rather than just a portion of the top layer of the liquid.

The dimensions of the confined channels are designed to provide a flow velocity gradient in the suspension of carbon nanotubes, wherein the flow velocity is at a minimum (e.g., zero) at the substrate surfaces and highest at or near the center of the flow. By way of illustration, some embodiments of the channels have a maximum spacing between the deposition substrate and the confinement substrate of 5 mm or shorter, including 3 mm or shorter, and further including 1 mm or shorter. For example, spacings in the ranges from 0.05 mm to 5 mm and from 0.1 mm to 3 mm can be used. Since the channels may not have a regular or symmetric cross-section, the spacing between the deposition substrate and the confinement substrate of a channel corresponds to the maximum spacing between the deposition substrate and the confinement substrate, as measured along a surface normal of the deposition substrate. Thus, if the deposition substrate and the confinement substrate are parallel, planar substrates separated by a gap, the spacing simply corresponds to the size of the gap. The lengths and, in the case of the closed confined channels, the widths of the channels are not particularly limited and can be selected to provide a carbon nanotube array over a desired surface area. By way of illustration, some embodiments of the channels have lengths of at least 1 mm, at least 10 mm, at least 100 mm, at least 1 m, or larger. Some embodiments of the closed channels have widths of at least 500 µm, at least 1 mm, at least 10 mm, at least 100 mm, at least 1 m, or larger. This includes closed channels having widths in the range from 500 µm to 500 mm, further includes closed channels having widths in the range from 700 µm to 30 mm, and still further includes closed channels having widths in the range from 1 mm to 20 mm.

The flow velocity of the suspension of carbon nanotubes in the channel will depend, in part, on the channel type and dimensions. In particular, for short or small diameter carbon nanotubes that are being deposited in a closed confined channel that does not use a liquid/fluid suspension interface to concentrate and align the carbon nanotubes (that is, a closed confined channel of the type illustrated in FIG. 1A), the flow velocity should be sufficiently high to produce a flow velocity gradient that is greater than the rotational diffusion coefficients of the carbon nanotubes in the suspension. In this type of close confinement channel, the rotational diffusion coefficient can be determined using Equation 5 in Tirado, M. M., Martinez, C. L., de la Torre, J. G. Comparison of theories for the translational and rotational diffusion coefficients of rod-like macromolecules. Application to short DNA fragments. *J. of Chem. Phys.* 87, 4, 2047-52. The flow velocity gradients are calculated assuming a plane Poiseuille flow with a symmetric parabolic velocity profile. For simplicity, this assumption is used here. However, for some systems, the profile may not be parabolic. In this calculation, assuming no slip conditions at the channel walls, the velocity as a function of position perpendicular to the channel is given as $$V(y) = V_{max} - \frac{\Delta P}{2\mu L}\left[\frac{d^2}{4} - y^2\right],$$

where $V_{max}$ is the maximum flow velocity at the center of the channel, µ is the viscosity of the fluid, L is the length of the channel, d is the diameter of channel, and ΔP is the pressure difference across the length of the channel. This pressure difference is given as $$\Delta P = \frac{Q}{h}\frac{12\mu L}{d^3}$$

where Q is the volumetric flow velocity, h is defined as the width of the channel, and all other variables are as stated previously. The flow velocity gradient at the wall can be determined from the derivative of the previous V(y) expression evaluated at the wall of the channel $$\frac{dV}{dy}\left(-\frac{d}{2}\right) = \frac{\Delta P}{\mu L}\left[\frac{d}{2}\right]$$

and will have units of mm/s/mm. In the context of a closed confined channel that does not use a liquid (e.g., water)/carbon nanotube suspension interface, as illustrated in Example 1 (see, FIG. 5, panel (a)), operating under conditions in which the flow velocity gradient is lower than the rotational diffusion coefficients of the carbon nanotubes results in the deposition of an array of randomly oriented (i.e., unaligned) carbon nanotubes. (It should be noted, however, that for deposition systems that utilize a liquid/fluid suspension interface to align the carbon nanotubes lower flow velocity gradients, including flow velocity gradients that are lower than the rotational diffusion coefficients of the carbon nanotubes, can be used.)

The optimal volumetric flow velocity will depend, at least in part, on the length and diameters of the carbon nanotubes being deposited. For example, for carbon nanotubes having lengths of approximately 500 nm and diameters of approximately 1.5 nm, the volumetric flow velocity may be selected to provide a velocity gradient of at least 120 mm/s/mm. However, larger velocity gradients can provide better alignment. Thus, in some embodiments of the methods, the fluid suspension of carbon nanotubes has a velocity gradient of at least 900 mm/s/mm. This includes embodiments of the methods wherein the fluid suspension of carbon nanotubes has a velocity gradient of at least 1500 mm/s/mm, and further includes embodiments of the methods wherein the fluid suspension of carbon nanotubes has a velocity gradient of at least 3000 mm/s/mm. In some embodiments the fluid suspension of carbon nanotubes has a velocity gradient in the range from 120 mm/s/mm to 66000 mm/s/mm; from 900 mm/s/mm to 60000 mm/s/mm; or from 1500 mm/s/mm to 30000 mm/s/mm. For longer and/or thicker carbon nanotubes lower velocity gradients may be more suitable, while for shorter and/or thinner carbon nanotubes higher velocity gradients may be more suitable.

The present methods do not require that all of the deposited carbon nanotubes be aligned; only that the average degree of alignment of the carbon nanotubes in the array is measurably greater than that of an array of randomly oriented carbon nanotubes. The degree of alignment in the deposited carbon nanotube arrays will depend on the flow rate and the flow channel geometry and dimensions. The degree of alignment of the SWCNTs in the arrays refers to their degree of alignment along their longitudinal axes within an array, which can be quantified using polarized Raman spectroscopy, as described in Joo et al., Langmuir, 2014, 30(12), pp. 3460-3466 ("Joo et al."). In some embodiments, the deposited arrays have a carbon nanotube mean degree of alignment of ±40° or better. (That is, the mean of the magnitude of misalignment for the carbon nanotubes in the array is no greater than 40°.) This includes embodiments in which the carbon nanotubes have a mean degree of alignment of ±20° or better, further includes embodiments in which the carbon nanotubes have a mean degree of alignment of ±4° or better, and still further includes embodiments in which the carbon nanotubes have a mean degree of alignment of ±1° or better. For some electronic device applications, such as channel layers in thin film transistors, imperfect alignment may be preferred in order to ensure continuous interconnectivity of the carbon nanotubes over a surface area having dimensions greater than the lengths of the carbon nanotubes.

The density of the carbon nanotubes in the deposited arrays will depend on a variety of factors, including the channel geometry (e.g., open or closed), whether the deposition method utilizes a liquid/fluid suspension interface, the concentration of carbon nanotubes in the deposition solution, and/or the duration of the deposition process. The density of carbon nanotubes in the arrays refers to their linear packing density, which can be quantified in terms of the number of carbon nanotubes per µm and measured as described in Joo et al. In some embodiments, the deposited arrays have a carbon nanotube density of at least 5 carbon nanotubes/µm. This includes embodiments in which the arrays have a carbon nanotube density of at least 20 carbon nanotubes/µm and at least 30 carbon nanotubes/µm.

The arrays can be deposited as highly uniform films over large surface areas, where a uniform film is a continuous film in which the carbon nanotubes are aligned along a substantially straight path, without domains of randomly oriented carbon nanotubes. The area over which the carbon nanotube arrays can be formed is not particularly limited and can be sufficiently large to cover an entire semiconductor wafer. By way of illustration, uniform carbon nanotube arrays can be deposited over surface areas of at least 1 mm$^2$, at least 10 mm$^2$, or at least 100 mm$^2$, or at least 1 m$^2$.

Depending on the intended application of the carbon nanotube arrays, it may be desirable to define a pattern in the arrays. For example, the arrays can be patterned into a series of lines, an array dots, and the like. The pattern can be defined in the array after it is formed. Therefore, some embodiments of the methods include a step in which the arrays are lithographically patterned using, for example, photolithography techniques. Alternatively, a pattern can be defined in the array as it is deposited by using a patterned deposition substrate having at least two surface domains, wherein the carbon nanotubes adhere more readily to one of the two surface domains than to the other. For example, selected areas on the surface of the deposition substrate can be coated or functionalized with a hydrophilic material and/or selected areas on the surface deposition substrate can be coated or functionalized with a hydrophobic material, such that the carbon nanotubes are preferentially deposited onto and aligned along the more hydrophilic domains.

The nature of the pattern will depend on the intended application of the array. For example, if an array of aligned s-SWCNTs is to be used as the channel material in a field effect transistor (FET), a pattern comprising a series of parallel stripes can be defined in the array. FETs comprising the arrays of aligned s-SWCNTs as channel materials generally comprise a source electrode in electrical contact with the channel material and a drain electrode in electrical contact with the channel material; a gate electrode separated from the channel by a gate dielectric; and, optionally, an underlying support substrate. Various materials can be used for the components of the FET. For example, a FET may include a channel comprising an array comprising aligned s-SWCNTs, a SiO$_2$ gate dielectric, a doped Si layer as a gate electrode and metal (Pd) films as source and drain electrodes. However, other materials may be selected for each of these components.

Example 1: Shear-Based Alignment of Polymer-Wrapped s-SWCNTs Using a Closed, Confined Channel This example illustrates methods of aligning carbon nanotubes using a closed, confined flow channel. As shown in this example, the degree of overall carbon nanotube alignment in the array can be controlled by varying the channel dimensions and the flow rate of the carbon nanotube suspension. The packing density of the carbon nanotubes in the array can be controlled by varying the concentration of the nanotubes in the suspension.

Methods:

The polymer coated nanotube suspension was initially extracted from a mixture of arc-discharge SWCNT powders (2 mg mL$^{-1}$) and PFO-BPy (American Dye Source, Inc., Quebec, Canada; #AD153-UV, 2 mg mL$^{-1}$). This mixture was sonicated with a horn tip sonicator (Fisher Scientific, Waltham, Mass.; Sonic dismembrator 500) for 30 min in toluene (60 mL). The solution was centrifuged in a swing bucket rotor at 300000 g for 10 min to remove undispersed material. The supernatant was then centrifuged and dispersed with sonication via the horn tip sonicator three times in toluene to rinse off as much excess PFO-BPy as possible. The final solution was prepared by horn-tip sonication of the rinsed SWCNT pellet in chloroform. The final concentrations of nanotubes in chloroform included 20 to 250 µg/mL, also including 20-150 µg/mL.

Devices having flow channels of different dimensions were fabricated in order to achieve a range of velocity gradients. For each device, a silicon dioxide substrate (Addison Engineering, 90 nm oxide) (i.e., a deposition substrate) was cleaned using a Piranha procedure (2:1 mixture of H$_2$SO$_4$:H$_2$O$_2$) for one hour. The substrate was then treated with hexamethyldisilazane (HMDS). The substrate was set on the bottom plate of a clamping device. This clamping device was composed of an aluminum bottom sheet and an aluminum top sheet, with holes for screws fed through the entire device on both sides. Nuts were tightened on the screws to ensure a proper seal. The aluminum top sheet had a hole near its center to provide a tubing inlet into the channel—this is how the carbon nanotube suspensions were introduced.

Figure 4:
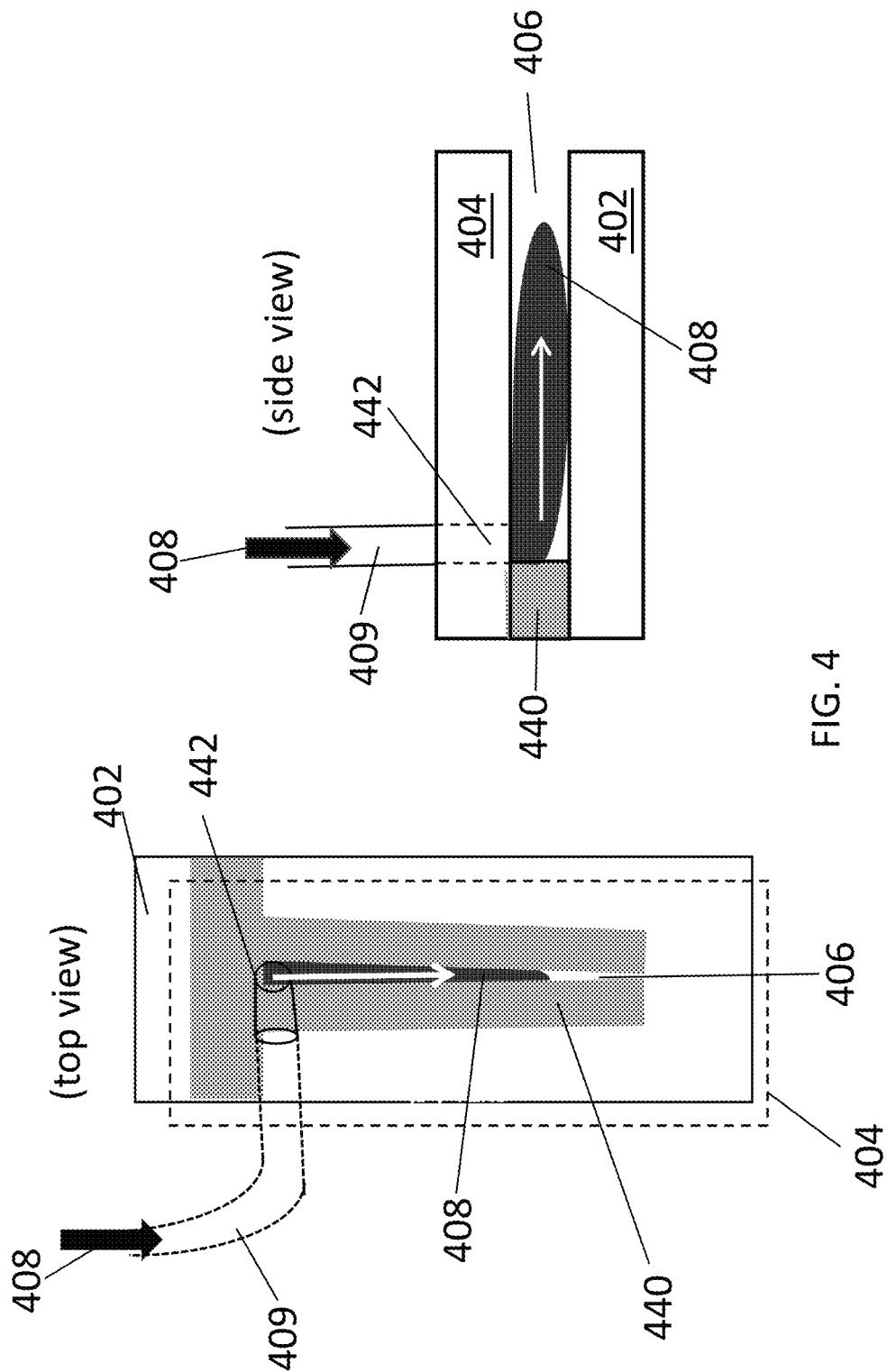
FIG. 4 is a schematic diagram showing a top view (left panel) and cross-sectional side view (right panel) of the closed, confined flow channel of Example 1.

A schematic diagram of the device used in this example is shown in FIG. 4. A mask 440 made out of perfluoroalkoxy (PFA) was formed on top of the silicon dioxide substrate 402 to define the side walls of a closed channel 406. PFA layer thicknesses of 0.127 mm to 1 mm were used in the different devices to form channels with widths ranging from 1 to 20 mm). The channel lengths ranged from 5 mm to 50 mm. A top glass plate (i.e., a confinement substrate) 404 with an entry port 442 for the fluid suspensions of carbon nanotubes was placed over the PFA mask, such that the hole in the aluminum top sheet and the entry port were aligned. A tube 409 was then inserted through the hole in the aluminum top sheet and the entry port to allow the fluid suspensions to be fed into channel 406.

Once the device was set up, a syringe pump was used to force the fluid suspensions 408 of carbon nanotubes through the device, whereby an array of aligned carbon nanotubes was deposited onto the silicon dioxide substrate in the channel. The typical duration of deposition was ~20 seconds, but longer deposition durations should show an increase in linear density without sacrificing the alignment quality. Volumetric flow rates in the range from 350 pt/min to 22000 µL/min were used to create velocity gradients in the range from 120 mm/s/mm to 66000 mm/s/mm in the closed channels.

After each suspension was passed through the device, pure chloroform was used to wash the remaining suspension from the channel to prevent random tubes from being deposited across the substrate in a "coffee stain" as the films dried in air. This substrate was also rinsed with isopropyl alcohol.

After deposition, the aligned carbon nanotube arrays were imaged with a scanning electron microscope (SEM) (Zeiss LEO 1530) to characterize the alignment. The alignment was also characterized using cross-polarized reflected light microscopy (Nikon Optiphot-2). The degree of alignment was estimated by measuring the angles of carbon nanotubes (approximately 60 carbon nanotubes) from typical areas of deposition from each sample. This data was then plotted as a histogram and the histogram was fit with a Gaussian peak, centered at θ=0°. The σ of the Gaussian was then calculated for each distribution and was used to represent the alignment range for each sample. The degree of alignment was shown to qualitatively increase with increasing velocity gradient with the alignment being random at 120 mm/s/mm and the alignment increasing so that the majority of the carbon nanotubes aligned within ±10° at 28000 mm/s/mm. While it was difficult to determine the density of carbon nanotubes for the 120 mm/s/mm because it was random, the linear density of carbon nanotubes was determined to be approximately 30 tubes/µm for the 900 and 4000 mm/s/mm samples and a slightly lower density of 22 tubes/µm for the 28000 mm/s/mm sample. This lower density was because a lower concentration solution was used for the deposition.

Figure 5:
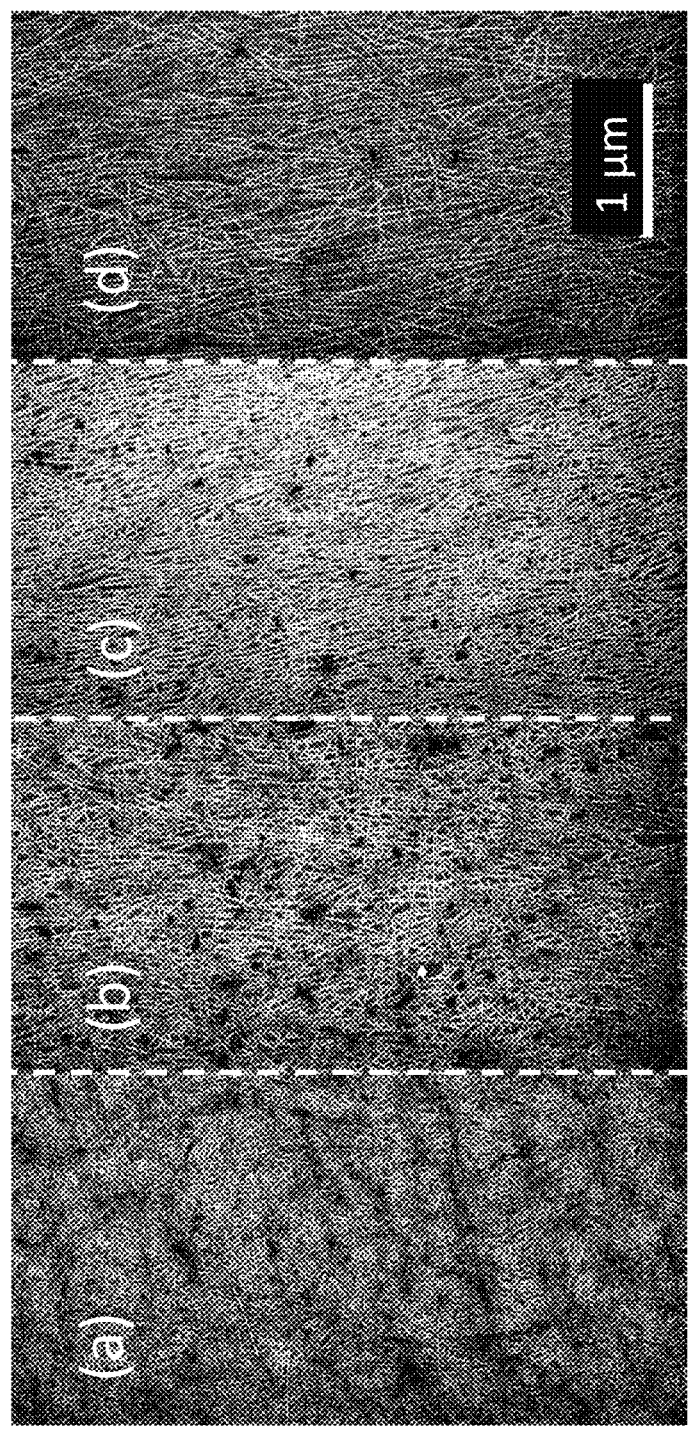
FIG. 5, panels (a)-(d) show SEM images of aligned carbon nanotube arrays deposited at different shear rates, in accordance with Example 1.

Discussion:

SEM images of arrays of aligned carbon nanotubes deposited at flow velocity gradients of 120 mm/s/mm, 900 mm/s/mm, 4000 mm/s/mm, and 28000 mm/s/mm are shown in panels (a), (b), (c), and (d) of FIG. 5, respectively. As shown in these panels, the carbon nanotubes in the array deposited under a velocity gradient of 120 mm/s/mm were effectively randomly distributed. However, increasing the velocity gradient (shear rate) increased the alignment of the carbon nanotubes.

Example 2: Alignment of Polymer-Wrapped s-SWCNTs Using an Open, Confined Channel This example illustrates methods of aligning carbon nanotubes using an open, confined flow channel. As shown in this example, the degree of overall carbon nanotube alignment in the array can be controlled by varying the channel dimensions and the flow rate of the carbon nanotube suspension.

Methods:

The polymer coated nanotube suspension was initially extracted from a mixture of arc-discharge SWCNT powders (2 mg mL$^{-1}$) and PFO-BPy (American Dye Source, Inch., Quebec, Canada; #AD153-UV, 2 mg mL$^{-1}$). This mixture was sonicated with a horn tip sonicator (Fisher Scientific, Waltham, Mass.; Sonic dismembrator 500) for 30 min in toluene (60 mL). The solution was centrifuged in a swing bucket rotor at 300000 g for 10 min to remove undispersed material. The supernatant was then centrifuged and dispersed with sonication via the horn tip sonicator three times in toluene to rinse off as much excess PFO-BPy as possible. The final solution was prepared by horn-tip sonication of the rinsed SWCNT pellet in the target solvent, i.e., chloroform, toluene, or 1,2-dichlorobenzene. The final concentrations of nanotubes in organic solvent included 1 to 50 µg/mL, also including 5-20 µg/mL.

Devices having flow channels of different dimensions were fabricated in order to achieve a range of velocity gradients. For each device, a silicon dioxide substrate (Addison Engineering, 90 nm oxide) (i.e., a deposition substrate) was cleaned using a Piranha procedure (2:1 mixture of $H_2SO_4$:$H_2O_2$) for one hour. The substrate was then treated with hexamethyldisilazane (HMDS).

A channel was created between the silicon dioxide substrate and a polytetrafluoroethylene (PTFE) substrate (i.e., a confinement substrate). In the different devices, the gap between the silicon dioxide substrate and the PTFE substrate (which corresponds to the diameter of the channel) was in the range from 0.7 mm to 3 mm. The channel was placed into a trough of water with a portion of the deposition and confinement substrates extending above the surface of the water, such that the water provided the floor of the channel.

The carbon nanotube suspension was dispensed from a needle inserted into the channel, at the surface of the water. As the suspension of carbon nanotubes was flowed through the channel, the silicon dioxide deposition substrate was translated vertically out of the water at a rate of 15 mm/min to move the fluid suspension/water interface across the substrate. This resulted in the deposition of an aligned carbon nanotube array across the surface of the silicon dioxide substrate.

After array deposition, the aligned carbon nanotube array was characterized using scanning electron microscopy (Zeiss LEO 1530) and cross-polarized reflected light microscopy (Nikon Optiphot-2). Carbon nanotube degree of alignment was qualitatively evaluated using scanning electron microscopy to confirm that velocity gradients induced carbon nanotube alignment self-assembly when the SWCNTs were dispersed in a range of organic solvents. Local regions of 1 µm$^2$ of the chloroform-based deposition exhibited excellent alignment, with the majority of carbon nanotubes aligned within ±3° (calculated as per the previous process in Example 1, using aprox. 30 nanotubes). The linear density was estimated for each sample as follows: 40, 30, and 22 tubes/µm for the chloroform-, toluene-, and 1,2-dichlorobenzene-based carbon nanotube suspensions, respectively.

Figure 6:
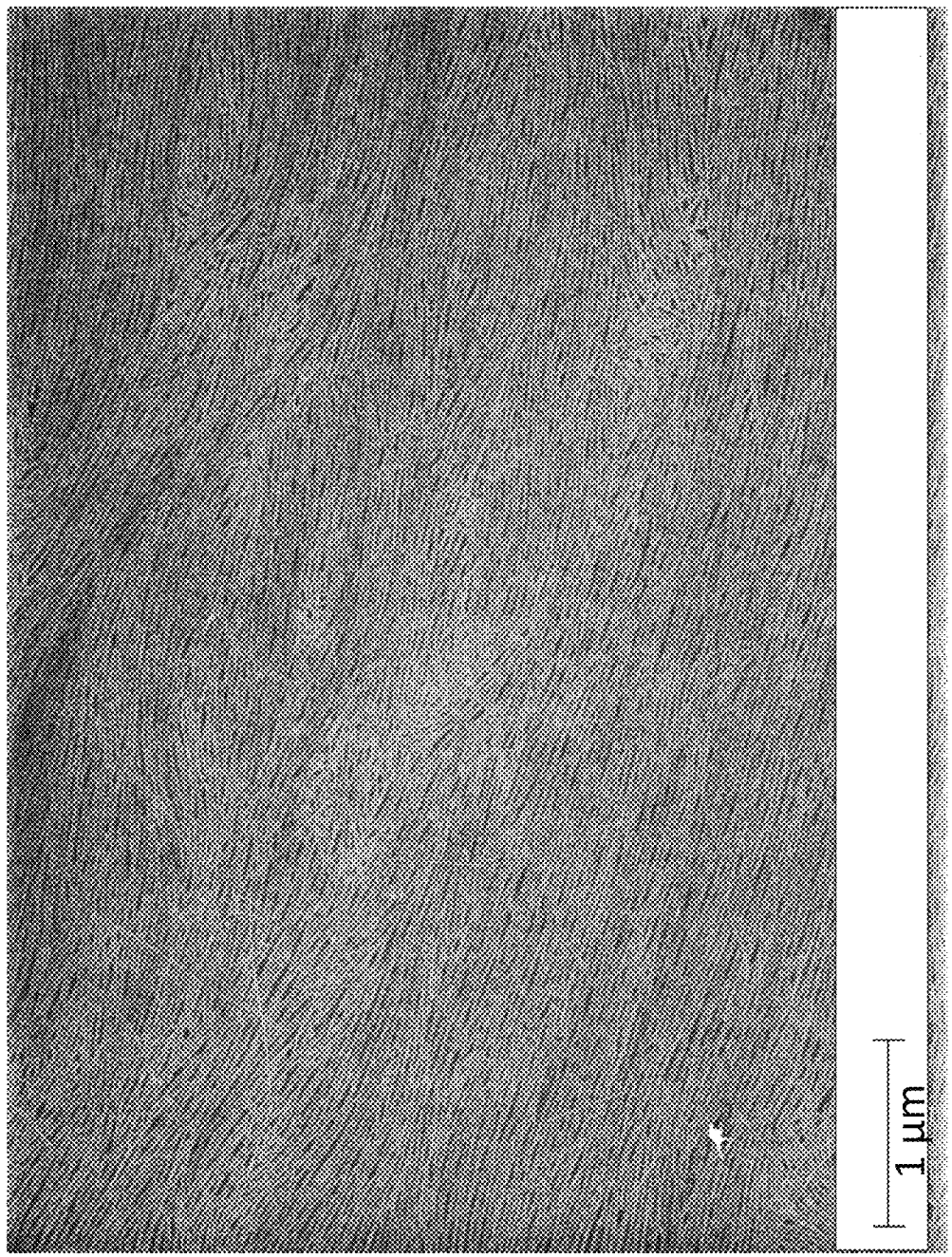
FIG. 6 is an SEM image of an aligned carbon nanotube array formed from a chloroform-based fluid suspension, in accordance with Example 2.
Figure 7:
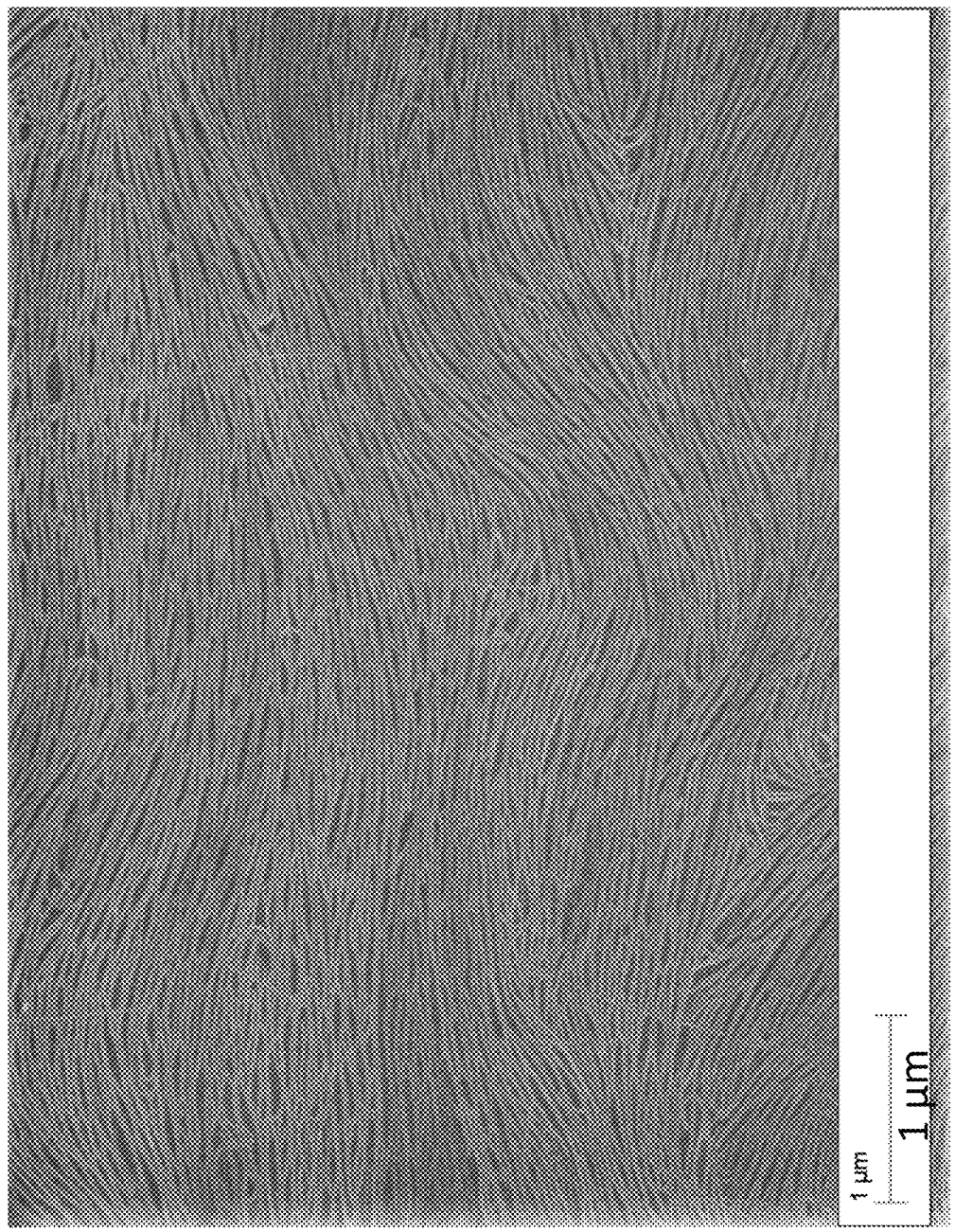
FIG. 7 is an SEM image of an aligned carbon nanotube array formed from a toluene-based fluid suspension, in accordance with Example 2.
Figure 8:
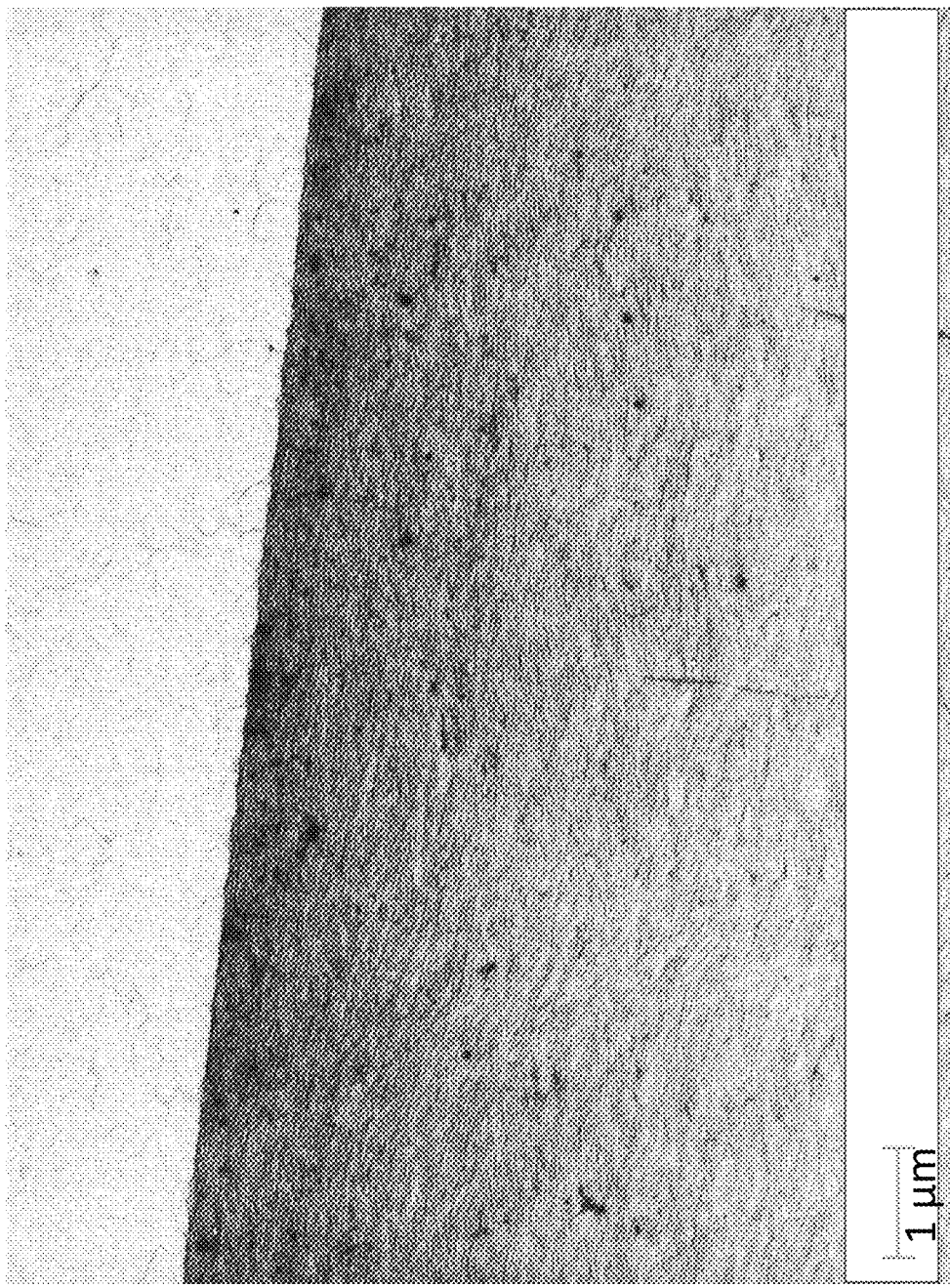
FIG. 8 is an SEM image of an aligned carbon nanotube array formed from a 1,2-dichlorobenzene-based fluid suspension, in accordance with Example 2.

Discussion:

An SEM image of an array of aligned carbon nanotubes deposited at a flow velocity gradient of roughly 5 mm/s/mm from the chloroform-based carbon nanotube suspension is shown in FIG. 6. An SEM image of an array of aligned carbon nanotubes deposited at flow velocity gradient of roughly 1.7 mm/s/mm from the toluene-based carbon nanotube suspension is shown in FIG. 7. An SEM image of an array of aligned carbon nanotubes deposited at flow velocity gradient of roughly 0.8 mm/s/mm from the 1,2-dichlorobenzene based carbon nanotube suspension is shown in FIG. 8. It was observed that carbon nanotube alignment in the arrays increased with increasing velocity gradient.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a carbon nanotube array, the method comprising:
   creating a shear flow of a fluid suspension of organic material-coated carbon nanotubes through a flow channel, wherein the flow channel is defined by a deposition substrate comprising a first material and a confining wall comprising a second material, wherein a velocity gradient is formed across the flowing fluid suspension and further wherein the flowing fluid suspension passes over the deposition substrate and exits the flow channel;
   depositing organic material-coated carbon nanotubes from the fluid suspension onto the deposition substrate to form a film of carbon nanotubes on the deposition substrate, wherein: the deposited organic material-coated carbon nanotubes in the film are aligned along the direction of shear flow; the film is formed while the fluid suspension is flowing over the deposition substrate; and the organic material-coated carbon nanotubes are aligned and deposited on the deposition substrate without the use of an energized electrode pair.

2. The method of claim 1, wherein the organic material coated carbon nanotubes consist essentially of semiconducting single-walled polymer coated carbon nanotubes.

3. The method of claim 1, wherein the velocity gradient has a magnitude of at least 900 mm/s/mm.

4. The method of claim 1, wherein the organic material-coated carbon nanotubes have lengths of no greater than 1 µm.

5. The method of claim 1, further comprising removing the organic material from the deposited organic material-coated carbon nanotubes.

6. The method of claim 1, wherein the flow channel is a closed channel.

7. The method of claim 6, wherein the fluid suspension of organic material-coated carbon nanotubes flows at a rate that is greater than the rotational diffusion coefficients of the carbon nanotubes in the fluid suspension and the flow channel has a width of at least 500 µm.

8. The method of claim 6, wherein the fluid suspension of organic material-coated carbon nanotubes flows at a rate that is at least twice as large as the rotational diffusion coefficients of the carbon nanotubes in the fluid suspension and the velocity gradient has a magnitude of at least 900 mm/s/mm.

9. A method of forming a carbon nanotube array, the method comprising:
  creating a shear flow of a fluid suspension of organic material-coated carbon nanotubes through a closed flow channel that is defined by a deposition substrate comprising a first material and a confining wall comprising a second material, wherein a velocity gradient is formed across the flowing fluid suspension;
  flowing a liquid that is immiscible with the fluid suspension through the closed flow channel along with the fluid suspension, wherein the fluid suspension and the liquid flow side-by-side and the organic material-coated carbon nanotubes are concentrated at the interface between the fluid suspension and the liquid, relative to their concentration in the bulk of the fluid suspension, and are aligned parallel with the interface; and
  depositing organic material-coated carbon nanotubes from the interface onto the deposition substrate, wherein the deposited organic material-coated carbon nanotubes are aligned along the direction of shear flow.

10. The method of claim 9, wherein the liquid is water.

11. The method of claim 9, further comprising translating the interface between the fluid suspension and the liquid across the deposition substrate.

12. The method of claim 9, further comprising flowing a solvent through the flow channel along with the fluid suspension and the liquid, wherein the fluid suspension flows between the liquid and the solvent.

13. A method of forming a carbon nanotube array, the method comprising:
  creating a shear flow of a fluid suspension of organic material-coated carbon nanotubes through a flow channel, wherein the flow channel is defined by: a deposition substrate comprising a first material; the confining wall comprising a second material, which is disposed opposite and facing the deposition substrate; and a floor comprising a layer of a liquid that is immiscible with the fluid suspension and is disposed between the deposition substrate and the confining wall, wherein a velocity gradient is formed across the flowing fluid suspension; and
  depositing organic material-coated carbon nanotubes from the fluid suspension onto the deposition substrate during the shear flow of the fluid suspension of the organic-material-coated nanotubes through the flow channel, wherein the deposited organic material-coated carbon nanotubes are aligned along the direction of shear flow.

14. The method of claim 13, wherein creating a shear flow of the fluid suspension of organic material-coated carbon nanotubes through the flow channel comprises flowing the fluid suspension of organic material-coated carbon nanotubes on the layer of the liquid.

15. The method of claim 13, wherein the liquid that is immiscible with the fluid suspension is water.

16. The method of claim 14, further comprising translating the fluid suspension of organic material-coated carbon nanotubes across the deposition substrate as it is flowing through the flow channel.

17. The method of claim 14, wherein creating a shear flow of the fluid suspension of organic material-coated carbon nanotubes through the flow channel further comprises flowing the layer of the liquid in the same direction as the fluid suspension of organic material-coated carbon nanotubes.

18. The method of claim 17, further comprising changing the volumetric flow rate of the fluid suspension of organic material-coated carbon nanotubes relative to the volumetric flow rate of the layer of liquid, such that an interface formed by the layer of liquid and the fluid suspension translates along the deposition substrate.

19. A method of forming a carbon nanotube array, the method comprising:
  creating a shear flow of a fluid suspension of organic material-coated carbon nanotubes through a flow channel, wherein a velocity gradient is formed across the flowing fluid suspension, the flow channel being defined by a deposition substrate comprising a first material and a confining wall comprising a second material and having a channel width of at least 500 µm; and
  depositing organic material-coated carbon nanotubes from the fluid suspension onto the deposition substrate while the fluid suspension is flowing through the flow channel, wherein: the deposited organic material-coated carbon nanotubes in the film are aligned along the direction of shear flow; the film is formed while the fluid suspension is flowing over the deposition substrate; and the organic material-coated carbon nanotubes are aligned and deposited on the deposition substrate without the use of an energized electrode pair.

20. The method of claim 19, wherein the flow channel has a channel height in the range from 0.5 mm to 5 mm.

21. The method of claim 9, wherein the organic material-coated carbon nanotubes from the interface are deposited onto the deposition substrate while the fluid suspension and the liquid flow side-by-side.

\* \* \* \* \*